United States Patent [19]

Bour et al.

[11] Patent Number: 5,465,263
[45] Date of Patent: Nov. 7, 1995

[54] MONOLITHIC, MULTIPLE WAVELENGTH, DUAL POLARIZATION LASER DIODE ARRAYS

[75] Inventors: David P. Bour, Cupertino; Thomas L. Paoli, Los Altos, both of Calif.

[73] Assignee: Xerox Corporation, Stamford, Conn.

[21] Appl. No.: 332,989

[22] Filed: Nov. 4, 1994

Related U.S. Application Data

[63] Continuation-in-part of Ser. No. 994,029, Dec. 12, 1992, and a continuation-in-part of Ser. No. 158,250, Nov. 29, 1993.

[51] Int. Cl.$^6$ ............................................. H01S 3/10
[52] U.S. Cl. .......................... 372/23; 372/45; 372/50
[58] Field of Search ........................ 372/23, 45, 50, 372/92, 22, 26

[56] References Cited

U.S. PATENT DOCUMENTS

| | | | |
|---|---|---|---|
| 4,817,110 | 3/1989 | Tokuda et al. | 372/45 |
| 4,993,036 | 2/1991 | Ikeda et al. | 372/50 |
| 5,033,053 | 7/1991 | Shimizu et al. | 372/50 |
| 5,138,624 | 8/1992 | Hong et al. | 372/45 |
| 5,228,050 | 7/1993 | LaCourse et al. | 372/50 |
| 5,319,655 | 6/1994 | Thornton | 372/23 |

OTHER PUBLICATIONS

A Model for GRIN–SCH–SQW Diode Lasers, by S. R. Chinn, P. S. Zory and A. R. Reisinger, IEEE Journal of Quantum Electronics, vol. 24, No. 11, Nov. 1988, pp. 2191–2214.

*Primary Examiner*—Léon Scott, Jr.
*Attorney, Agent, or Firm*—Rosen, Dainow & Jacobs

[57] ABSTRACT

Structures and fabrication methods for achieving multiple wavelength, dual polarization laser diode arrays using single or multiple quantum well (QW) active regions that are able to support either TE-or TM-mode operation are described. Multiple wavelengths are obtained from either separate active regions, or by forcing a long-wavelength structure to oscillate at a short wavelength through bandfilling of the QW active region. By using tensile-strained QW active regions with or without separate confinement structures, multiple-wavelength dual-polarization lasers and laser arrays can be formed from a single active region.

75 Claims, 4 Drawing Sheets single or multiple QW active region for TE-and TM-mode gain at $\lambda_1$ and $\lambda_2$

MONOLITHIC, MULTIPLE WAVELENGTH, DUAL POLARIZATION LASER DIODE ARRAYS

This invention relates to semiconductor lasers employing quantum well active layers.

RELATED APPLICATION (1) Commonly-assigned, prior filed application, Ser. No. 07/994,029, filed Dec. 12, 1992, entitled "MULTIPLE BEAM SOLID-STATE QW LASER USING CONFIGURED STACKED LAYERS", abandoned Apr. 1, 1994, in the names of Robert C. Thornton, Gregory J. Kovacs, and David P. Bour, of which the present application is a continuation-in-part.

(2) Commonly-assigned, prior filed application, Ser. No. 08/158,250, filed Nov. 29, 1993, entitled "MULTIPLE WAVELENGTH, DUAL POLARIZATION, LASER DIODE ARRAYS", in the names of David P. Bour, Kevin J. Beernink, and Robert L. Thornton, abandoned Mar. 6, 1995, of which the present application is a continuation-in-part.

OTHER RELATED APPLICATIONS (3) Commonly-assigned, prior filed application, Ser. No. 07/948,524, filed Sep. 22, 1992, entitled "MULTI-BEAM, ORTHOGONALLY-POLARIZED EMITTING MONOLITHIC QUANTUM WELL LASERS", in the names of D. W. Treat, D. P. Bour and T. L. Paoli now U.S. Pat. No. 5,412,678.

(4) Commonly-assigned, prior filed application, Ser. No. 07/948,522, filed Sep. 22, 1992, entitled "POLARIZATION SWITCHABLE QUANTUM WELL LASER", in the names of D. W. Treat, D. P. Bour, and T. L. Paoli now U.S. Pat. No. 5,396,508.

(5) Commonly-assigned application, Ser. No. 07/949,452, filed Sep. 21, 1992, entitled "MONOLITHIC MULTI-WAVELENGTH LASER DIODE ARRAY", in the names of David F. Welch, Robert G. Waarts, Jo S. Major, Ross D. Bringans, David K. Fork, G. A. Neville Connell, and Robert L. Thornton now U.S. Pat. No. 5,384,797.

(6) Commonly-assigned, co-pending application, Ser. No. 08/173,812, filed Dec. 23, 1993, entitled "DUAL POLARIZATION LASER DIODE WITH QUATERNARY MATERIAL SYSTEM", in the names of T. L. Paoli and D. P. Bour abandoned Feb. 17, 1995.

BACKGROUND OF THE INVENTION

There exist many applications for laser diodes, especially laser diode arrays, that can simultaneously or selectively emit separable light from different array elements. Examples are color printing, full color digital film, recording, color displays, and optical recording and playback systems. Building the laser array into a monolithic structure in which the emitting regions are closely spaced offers the further important advantage that all of the optical sources can share a common lens system. It is also important in a number of these applications that the emitting regions in the monolithic structure are individually addressable, and it is also important to be able to individually detect such closely-spaced beams and process any information contained as a result of beam modulation at the source or by reflection from or transmission through optical media.

There are several ways to generate from a laser diode light beams with unique characteristics that will make the beams easier to separate or detect. One way is to change its polarization; a second way is to change its wavelength. Each of the applications referenced above describe either arrays of multi-wavelength laser diodes, or arrays of dual-polarization diodes.

The first above-referenced related application, Ser. No. 07/994,029, whose contents are herein incorporated by reference, describes a structure for generating multiple wavelength or orthogonally polarized beams from a monolithic, addressable, laser diode chip. The structure comprises a stack of epitaxially-deposited layers including multiple, vertically-stacked, quantum well (QW) heterostructures of the same or different compositions, and capable of oscillating at different wavelengths or orthogonal polarizations. The QW structures may be at different levels. By selective etching and/or diffusion techniques, laterally-spaced QW structures can be isolated and separately activated for individual addressing.

The third and fourth above-referenced applications, Ser. Nos. 07/948,524 and 07/948,522, whose contents are herein incorporated by reference, describe the construction and method of manufacture on a common substrate of individually addressable QW lasers that can be caused to oscillate in the transverse electric (TE) or in the transverse magnetic (TM) mode, and QW laser constructions that can be switched from oscillating in the TE polarization mode to the TM polarization mode, or vice versa. This has been accomplished in certain material systems by controlling the type of strain induced in an epitaxially deposited active region due to lattice mismatches with the substrate. Thus, in most material systems allowing heavy hole and light hole transitions, when the n=1 heavy hole is the lowest energy state and therefore the state whose population is most easily inverted, usually true for unstrained and compressively strained III–V alloy systems, TE polarization gain will predominate. However, by reversing the light hole and heavy hole band edges, achieved in certain material systems by inducing tensile strain into the active region, TM polarization gain will predominate. In the degenerate condition, where the light hole and heavy hole bands are substantially coincident in energy, the polarization of the emission can be determined by threshold carrier density and other factors, such as temperature, facet reflectivity, cavity length and intracavity optical loss.

In general, the desired result of controlling polarization can be achieved with either a single QW, carefully adjusted, or separate Qws for TE and TM mode gain, respectively, with the polarization mode of laser oscillation dependent upon the gain characteristic and the threshold gain. The necessary gain characteristic has one polarization with lowest transparency current, and the orthogonal polarization with a greater peak gain. For some range of active region parameters (thickness, composition, placement within the confining regions, etc.), these characteristics can be obtained, and so the polarization will be determined by the threshold gain. Therefore, the polarization of each device can be selected, for example by introducing an additional loss into one of the devices, thereby forcing it to oscillate in the higher-gain polarization. On the other hand, a device without this additional loss will simply oscillate in the polarization which has lowest transparency current. The additional loss could be an unpumped section along the cavity, low mirror reflectivity, shorter cavity, etc. Similarly, the polarization of each device could be switched, by using an intracavity loss modulator. This polarization selectivity mechanism is demonstrated by the polarization-dependent gain-current characteristics shown in FIG. 1 in which threshold gain, $g_{th}$, for both TM and TE modes is plotted along the ordinate, and threshold current, $I_{th}$, for both modes is plotted along the abscissa. The curve 10 labelled TE shows the gain characteristic for the TE-mode, and the curve 11 labelled TM that for the TM-mode. When the operating conditions are represented by the vertical line 13, to the left of the crossover 14, then the TE-gain is higher and TE-polarized light is emitted. When the operating conditions are represented by the vertical line 15, to the right of the crossover 14, then the TM-gain is higher and TM-polarized light is emitted.

The fifth referenced prior application, Ser. No. 07/949,452, whose contents are herein incorporated by reference, describes a laser diode array comprising a monolithic body with heterostructures comprising a composite active region made up of two or more adjacent QW layers of dissimilar materials. The composite active region is partially disordered by an impurity free interdiffusion of atomic constituents of the QW layers so as to shift the emission wavelength of the active region. By disordering different areas of the active region to different degrees, the different areas will lase at different wavelengths. Distributed Bragg Reflector (DBR) gratings may be added to enhance desired emission wavelengths. As an alternative, a ferroelectric layer structure may be added to double the frequency of emitted light from selected regions of the array.

The third, fourth and fifth related applications specifically describe only dual polarization or multiple wavelength laser diode arrays, but no monolithic structure capable of selectively producing four or more separable emissions.

The first related application also describes a monolithic structure with either multiple wavelength emissions or dual polarized emissions, and also suggests their combination in a single structure. However, no examples are given of how such a structure can be achieved.

SUMMARY OF THE INVENTION

An object of the invention is a monolithic multiple wavelength, dual polarization laser diode array.

Another object of the invention is a solid-state, monolithic laser with side-by-side orthogonally polarized QW lasers capable of operation at different wavelengths.

A further object of the invention is a solid-state QW laser providing four beams each uniquely different from the other beams with respect to its wavelength, polarization or both.

These and further objects and advantages of the invention are achieved with monolithic structures providing separate active regions capable of emitting at different wavelengths, or by forcing a long wavelength structure to oscillate at a short wavelength through band filling of a QW active region. Each of the active regions is capable of supporting orthogonal polarization modes. Similarly, by using tensile-strained active regions and/or confinement structures, multiple-wavelength, dual-polarization lasers and laser arrays can be formed from a single active region. It is thus possible to realize multiple-element, easily separable sources, for instance a four-source chip containing dual wavelengths and dual polarizations.

The above and further objects, details and advantages of the present invention will become apparent from the following detailed description of preferred embodiments thereof, when read in conjunction with the accompanying drawings.

DETAILED DESCRIPTION OF PREFERRED EMBODIMENTS

The present invention in several embodiments combines features described in the various referenced related applications, and in particular discloses how, in a monolithic structure, it is possible to provide a device structure that will provide at least four beams, uniquely different and easily separable as a result of such unique differences. The differences will be based on at least two different wavelengths, $\lambda_1$ and $\lambda_2$, and orthogonal polarizations, TE and TM. Thus the first of the four beams can be TE polarized at $\lambda_1$, the second TM polarized at $\lambda_1$, the third TE polarized at $\lambda_2$, and the fourth TM polarized at $\lambda_2$. This pattern can be repeated in the array as multiples of four-beams. Furthermore TE polarized and TM polarized beams can be added at different wavelengths as needed.

Figure 2:
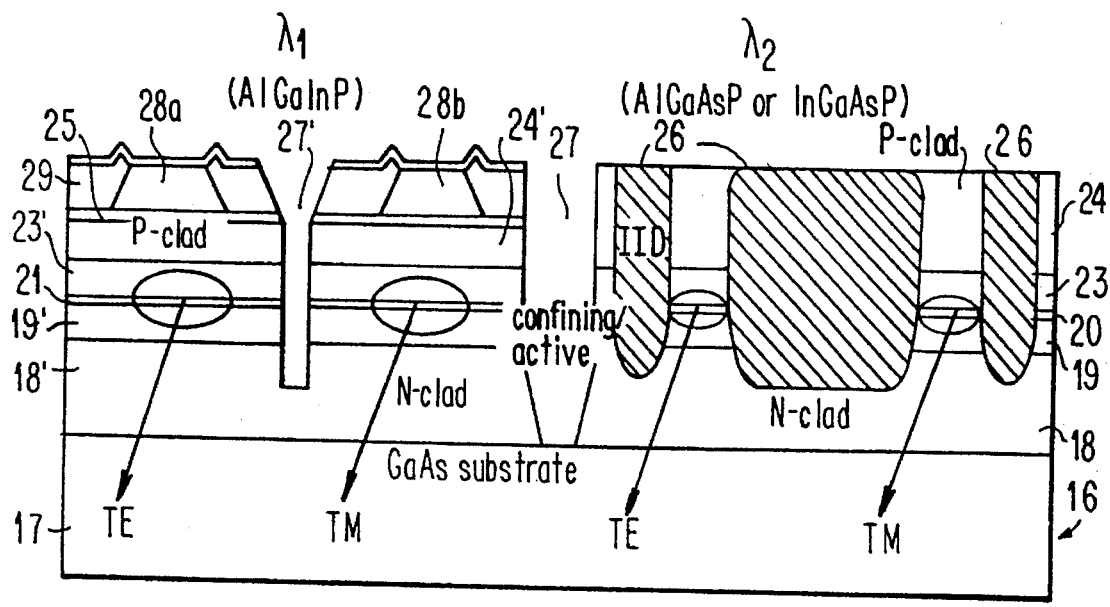
FIG. 2 is a schematic view of one embodiment of a diode laser array in accordance with the invention.

FIG. 2 schematically illustrates a first embodiment of a device structure for a dual-wavelength, dual polarization laser diode source fabricated with a two-step (selective) growth process. The device 16 comprises a substrate 17, for example of GaAs, on which is grown by conventional techniques well known in this art, the layers for the two right-hand lasers, including an N-type cladding layer 18, a lower confinement layer 19, an active layer 20, an upper confinement layer 23, an upper cladding layer 24, and a capping layer(s) (not shown) for ohmic contact. Following this first epitaxy, the layers are locally etched down to the substrate 17, through a patterned mask, for example of $SiO_2$ or $Si_3N_4$. With the mask remaining in place to serve further as a mask for selective epitaxial growth, the layers for the left-hand lasers are epitaxially deposited in the etched regions, thus creating the side-by-side laser diode layers for two wavelengths on a common substrate. The layers for the left-hand side lasers include an N-type cladding layer 18', a lower confinement layer 19', an active layer 21, an upper confinement layer 23', an upper cladding layer 24', and a capping layer(s) (not shown) for ohmic contact. The cladding and confining layer materials can be the same or different for the devices of the two wavelengths.

Alternatively, the layers may be locally etched down to the N-cladding layer 18 or the lower confinement layer 19 before regrowing the layers for the left hand lasers. An advantage of both approaches is that the active layers for the left and right lasers can be made to be nearly in the same plane by controlling the thickness of the layers grown above the common base. Furthermore the active layers can be individually optimized for each wavelength.

Subsequent to the growth of the layers on the left side of FIG. 2, lasers are provided for these layers in a known manner by forming mesas 28a and 28b through etching the upper cladding layer down to etch stop layer 25 and then selectively growing a blocking layer 29 over the etch stop layer and mesas with the etching mask in place. Lasers are then provided in the layers on the right side of FIG. 2 in a known manner (U.S. Pat. No. 4,870,652 to Thornton) by defining impurity induced layer disordered (IILD) regions 26. Isolating groove 27 is provided to optically and electrically separate the structure on the left from that on the right. Isolating groove 27' is provided to optically and electrically separate lasers defined by the mesas on the left side of FIG. 2. An isolation groove is usually not needed between lasers formed with IILD. Separate electrodes (not shown) are provided to enable individual addressing of each laser element on the left and right sides and the usual reflecting or mirror facets are provided at opposite ends of the structure to form an optical cavity for each laser.

Alternately all laser elements in monolithic structure 16 can be formed with IILD as illustrated on the right side of FIG. 2 or with the etch and regrowth process used to form the lasers illustrated on the left side of FIG. 2. For generality we have disclosed a monolithic structure utilizing both types of lasers.

Figure 1:
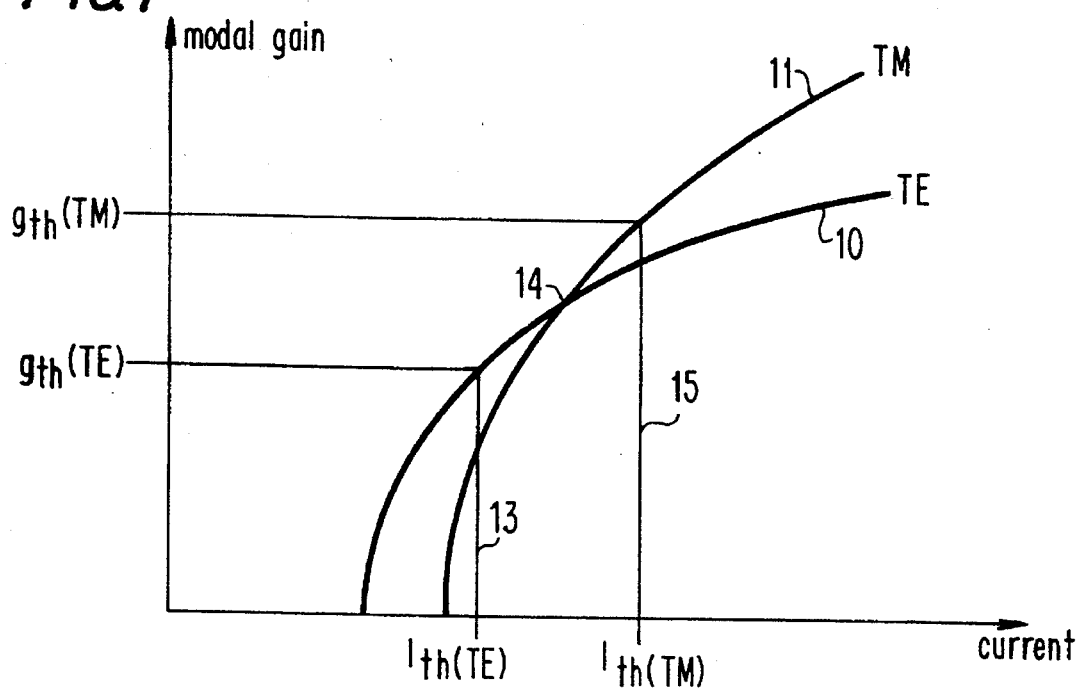
FIG. 1 shows the gain-current characteristics of a QW active region for achieving orthogonal polarizations in accordance with one form of laser diode array in accordance with the invention.

The active layers for the left and right sides of the embodiment in FIG. 2 can each be a single quantum well that provides both TE and TM-mode gain. As described above and in the third referenced application, the polarization of the laser mode depends upon the gain characteristic and the threshold gain. The necessary gain characteristic has one polarization with lower transparency current and the orthogonal polarization with a greater peak gain, as illustrated in FIG. 1. The third referenced application teaches how to obtain this characteristic by appropriate choice of active region parameters. e.g. thickness, composition, placement within the confining region, etc. For the embodiment of FIG. 2, the left and right quantum wells have different compositions to provide different wavelengths. For example, active layer 21 can be constructed from the AlGaInP material system in order to provide lasing beams (represented by the two ovals on the left) at a short wavelength $\lambda_1$ (600 nm band), while active layer 20 can be constructed from the AlGaAsP or InGaAsP to provide lasing beams (represented by the two ovals on right) at a long wavelength (800 nm band). See, for example the description given in the sixth referenced application, whose contents are herein incorporated by reference.

The advantage of this embodiment is that the active layers are separately grown and can therefore be separately optimized for operation at different wavelengths. In essence the structure shown in Figure Z has only two active layers, 20 and 21, thus yielding two different wavelengths, but four easily separable beams are obtained by selecting either of two orthogonal polarizations for the laser oscillation in different zones of each active layer. The polarization of the lasing mode in each zone is selected or controlled by introducing a different amount of fixed loss (or a loss modulator in the case of polarization switching) into each laser cavity as taught in the third and fourth above-referenced applications.

Figure 3:
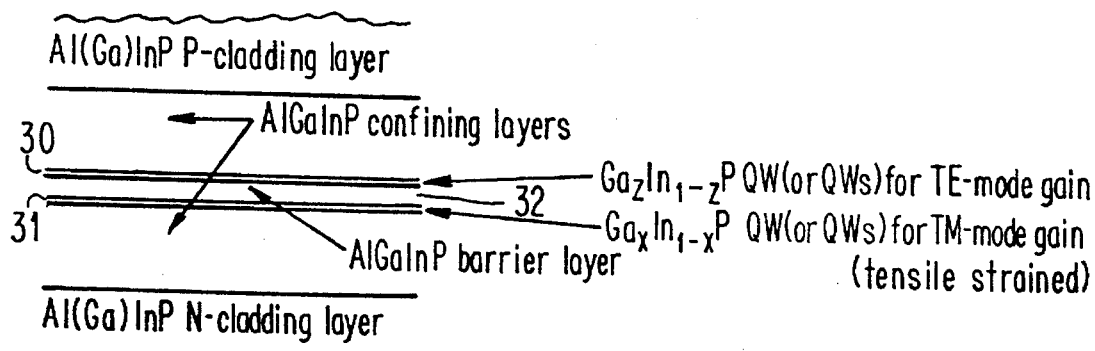
FIG. 3 is a schematic view of a second embodiment of the active layer for a diode laser array made in accordance with the invention.

Alternatively, the active layers for the left and right sides of FIG. 2 can each be composed of two quantum wells, one for TE-mode gain and the other for TM-mode gain, separated by a barrier layer 32. This configuration is illustrated in FIG. 3 for one set of GaInP quantum wells intended for operation at 600–660 nm. The $Ga_zIn_{1-z}P$ parameter z for the formula of the TE-mode gain layer 31 is $0.2<z<0.5$, whereas x in the $Ga_xIn_{1-x}P$ formula for the TM-mode layer 30 is $0.5<x<0.7$. In this case, the TE-mode gain layer 31 would typically be unstrained or compressively strained, whereas the TM-mode gain layer would typically be tensile-strained. With the left diode pair using GaInP for $\lambda_1$ emission, a suitable active layer for $\lambda_2$ emission from the right diode pair would comprise a similar pair of quantum wells of $GaAs_{1-x}P_x$ ($0<x<0.3$) with different values of x. The advantage of this embodiment is that the quantum wells can be separately optimized for TE-mode and TM-mode gain as well as for operation at two different wavelengths.

Multiple-wavelength, dual polarization diode laser arrays can be formed in the embodiment of FIG. 2 in several alternate ways. The active layers for the left and right sides of FIG. 2 can each be composed of pairs of quantum wells separated by a barrier layer, where each pair is capable of lasing at a different wavelength and one quantum well of each pair is for TE-mode gain while the other is for TM-mode gain. Alternatively, the active layers for the left and right sides of FIG. 2 can each be composed of multiple quantum wells separated by barrier layers, where each quantum well is capable of lasing at a different wavelength and the quantum wells on one side have lowest transparency current for TE-modes while the quantum wells on the other side have lowest transparency current for TM-modes.

Figure 6:
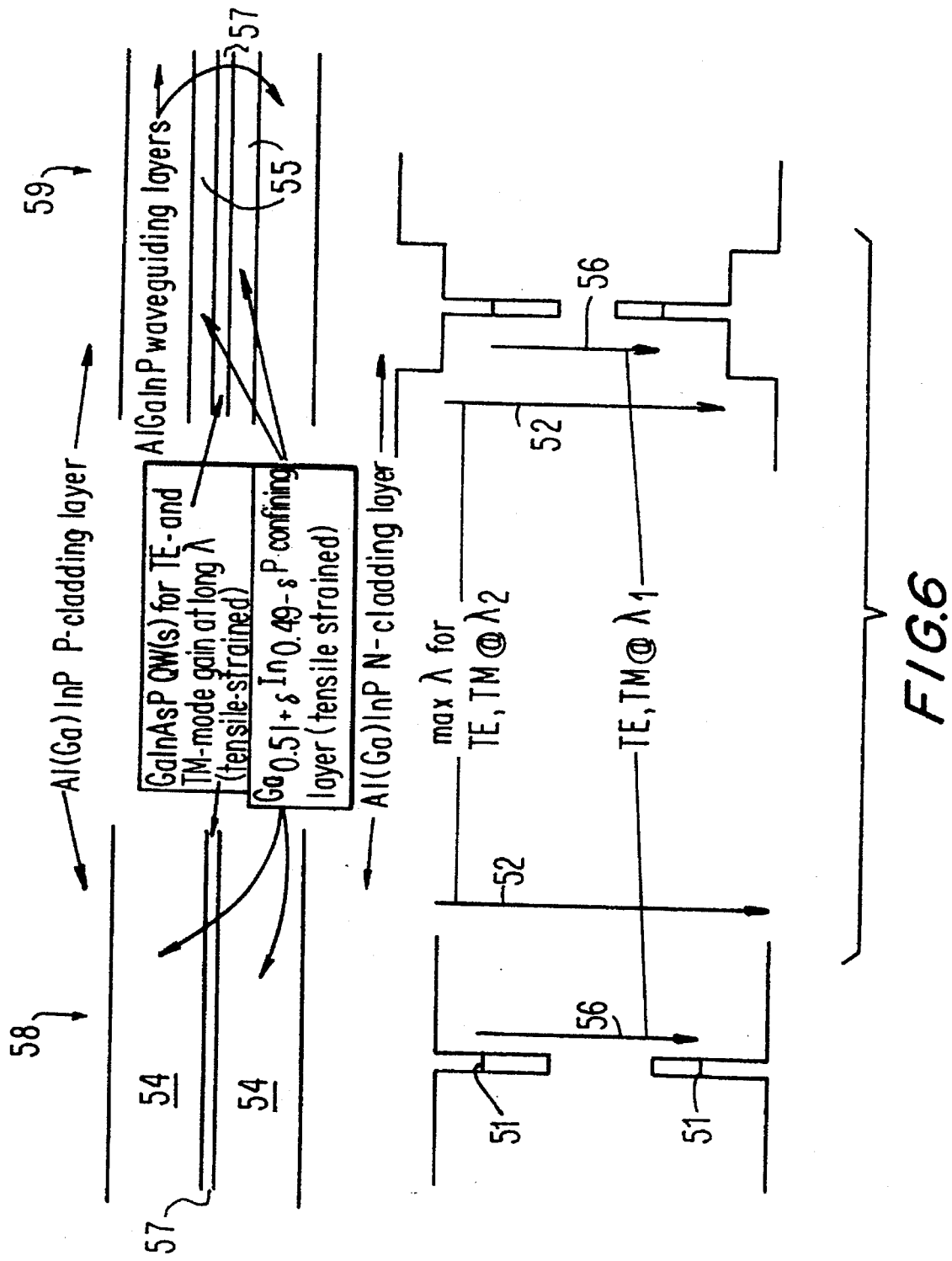
FIG. 6 is a schematic view of a fourth embodiment of the active layer for a diode laser array made in accordance with the invention.
Figure 7:
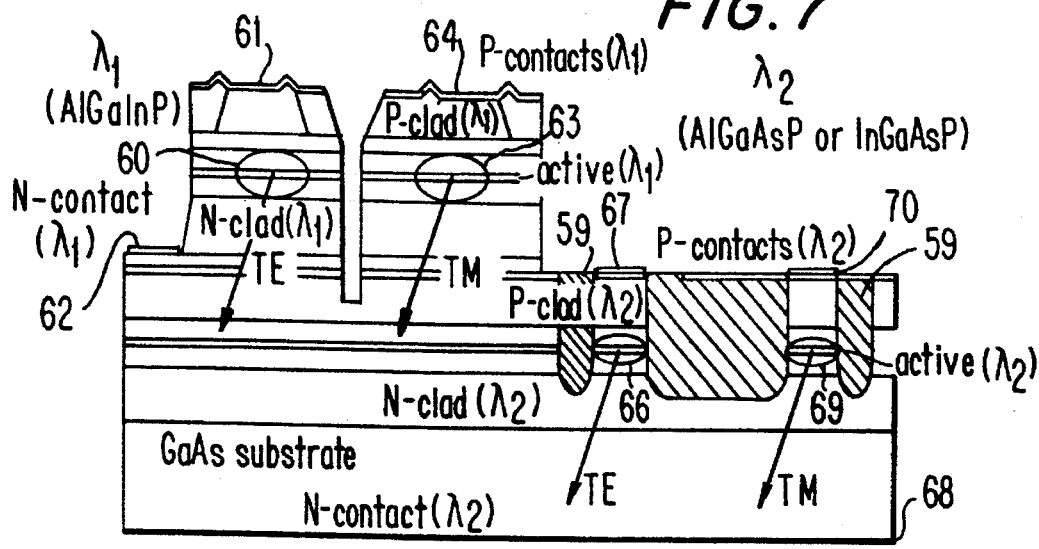
FIG. 7 is a schematic view of a second embodiment of a diode laser array in accordance with the invention.

A second embodiment of this invention using separately grown active layers is shown in FIG. 7. In this case, separated laser structures are epitaxially grown in a single growth cycle by vertically stacking the layers. This configuration has the advantage that it is accomplished in a single growth without the etch and regrowth required to form the embodiment of FIG. 2, while the active layer for each wavelength can still be individually optimized. This configuration is however disadvantaged in that all four lasing zones do not lie in nearly the same plane. For some applications the separation in the vertical direction is acceptable. In the embodiment of FIG. 7, the various layers depicted are grown uniformly across the wafer. The active layer for this embodiment can alternately be the single QW active layer used in FIG. 2, the single QW active layer of FIG. 6, or the dual QW active layer illustrated in FIG. 3. After the uniform growth, etch and regrowth can be used to form mesas for lasing zones 61 and 64 in the short wavelength layers. The layers corresponding to the short wavelength laser are then selectively removed in regions adjacent to these mesa lasers by etching to expose the p-contact layer for the long wavelength laser. IILD in regions 59 can then be applied to define two lasing zones in the long wavelength layers. Appropriate contacting and groove isolation is then provided to form the four lasing zones required. The polarization for each lasing zone is selected by introducing a different amount of loss into each laser cavity as taught in the third and fourth above-referenced applications. In this example, the TE-mode lasing zone 60 at $\lambda_1$ on the far left uses top contact 61 and side contact 62 for addressing while the adjacent TM-mode lasing zone 63 also at $\lambda_1$ uses the top contact 64 and side contact 62. The TE-mode lasing zone 66 at $\lambda_2$ uses top contact 67 and bottom contact 68 while the TM-mode lasing zone 69 at $\lambda_2$ on the far right uses top contact 70 and bottom contact 68.

Alternately all lasing zones in the monolithic structure of FIG. 7 can be formed with IILD as shown on the right side of FIG. 2 or with the etch and regrowth process used to form the lasers shown on the left side of FIG. 2. For generality we have disclosed a monolithic structure utilizing both types of lasers.

Multiple-wavelength, dual polarization diode laser arrays can be formed in the embodiment of FIG. 7 in several alternate ways. The upper and lower active layers of FIG. 7 can each be composed of pairs of quantum wells separated by a barrier layer, where each pair is capable of lasing at a different wavelength and one quantum well of each pair is for TE-mode gain while the other is for TM-mode gain. Alternatively, the upper and lower active layers of FIG. 7 can each be composed of multiple quantum wells separated by barrier layers, where each quantum well is capable of lasing at a different wavelength and the quantum wells in one active layer have lowest transparency current for TE-modes while the quantum wells in the other active layer have lowest transparency current for TM-modes.

Figure 8:
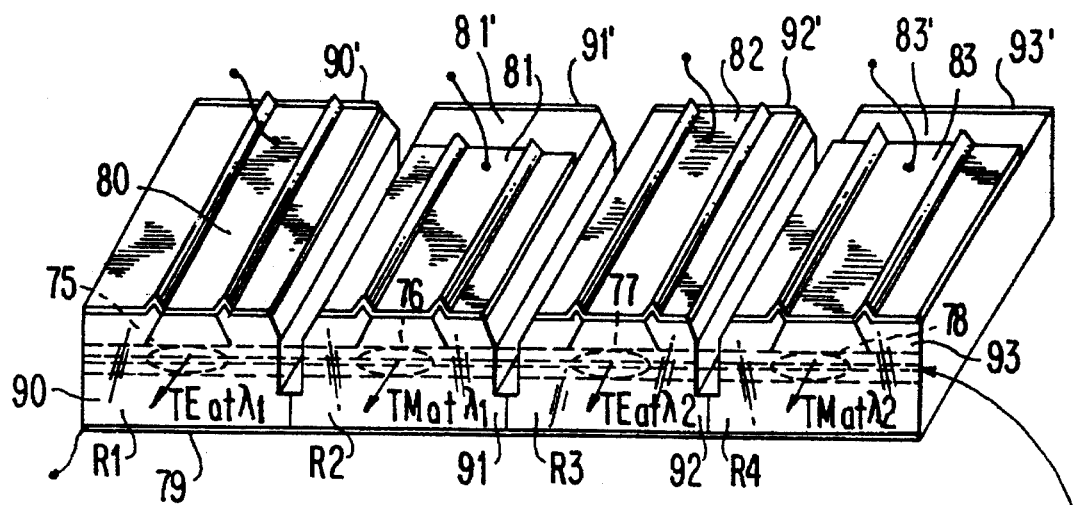
FIG. 8 is a schematic view of a third embodiment of a diode laser array in accordance with the invention.

A third embodiment of this invention wherein all four lasing zones have the same active layer is shown schematically in FIG. 8. Using the same active layers in all four lasing zones is advantageous because it eliminates the regrowths required to fabricate lasers with different active layers as illustrated in FIG. 2 and enables all lasing zones to be in the same plane in contradistinction to the embodiment of FIG. 7. The individual lasing zones are defined by rib waveguides as illustrated in FIG. 8 or alternately by IILD regions as illustrated in FIG. 2. The wavelength and polarization for each lasing zone is selected by introducing a different amount of loss into each laser cavity as taught in the third and fourth above-referenced applications. The lasers share a common contact 79 at the bottom and each is individually addressed by its own top contact 80–83. In this way a monolithic laser array providing four lasing zones 75, 76, 77, 78 at different wavelengths with different polarizations is enabled.

Figure 5:
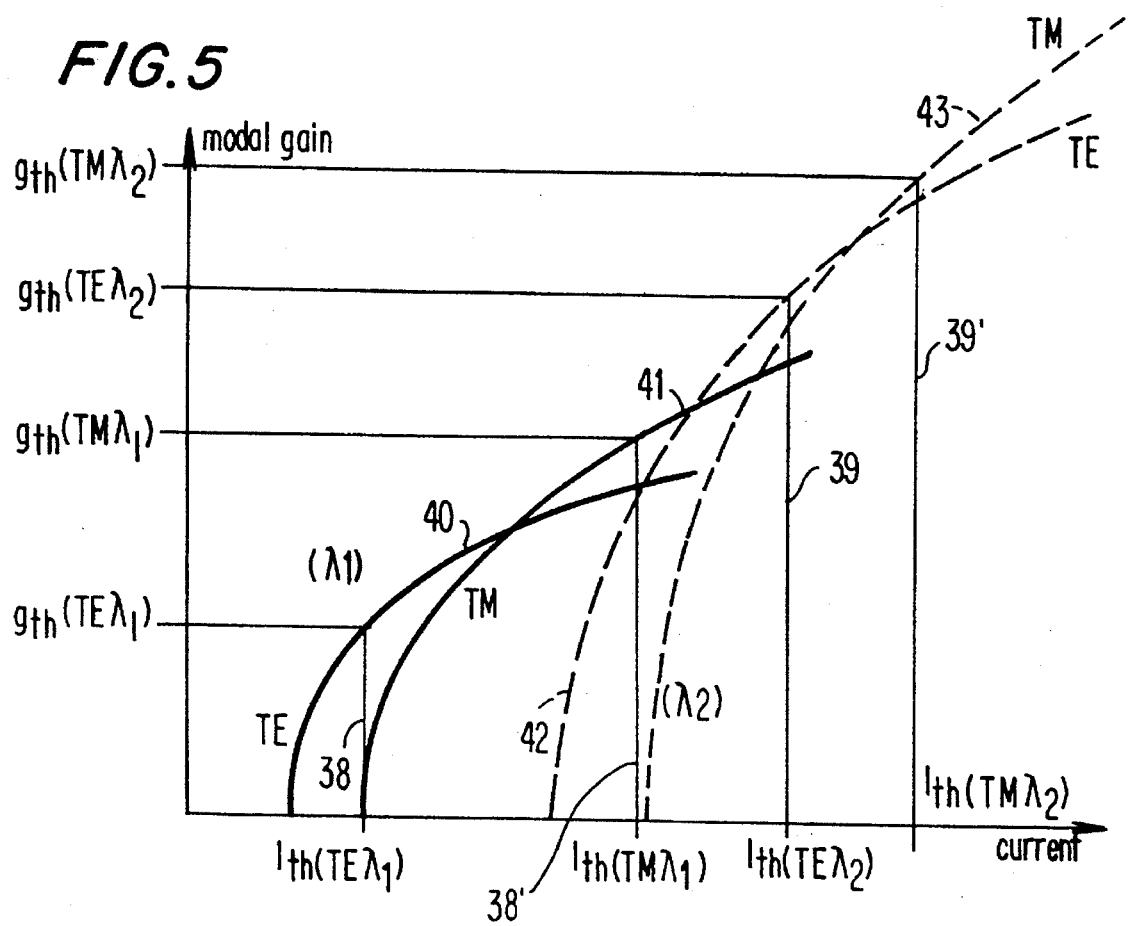
FIG. 5 shows the gain-current characteristics for the active layer embodiment of FIG. 4.
Figure 4:
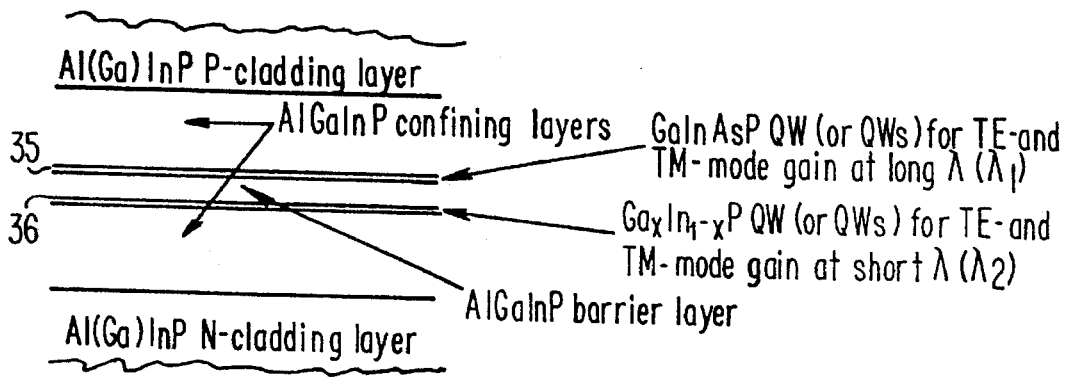
FIG. 4 is a schematic view of a third embodiment of the active layer for a diode laser array made in accordance with the invention.

An active layer for this embodiment is illustrated in FIG. 4. The upper active quantum well 35 for emission at the longer wavelength, $\lambda_1$, employs GaInAsP, whereas the lower active QW 36 for emission at the shorter wavelength, $\lambda_2$, employs $Ga_xIn_{1-x}P$, with $0.5<x<0.55$. As one example, for tensile-strained GaInAsP, $\lambda_1$ would be 700–850 nm, and for tensile-strained $Ga_xIn_{1-x}P$ (with $x\approx 0.54$), $\lambda_2$ would be 650 nm. Both QWs exist in all four lasing zones, but with two of the four operating at $\lambda_1$ with orthogonal polarizations, and the other two operating at $\lambda_2$ with orthogonal polarizations. Preferably, each QW 35,36 is under biaxial tension and designed for near-degenerate light-hole and heavy-hole band edges, and so, individually, each QW has TE- and TM-mode gain characteristics like that illustrated in FIG. 1. The superposition of these TE- and TM-mode gain characteristics of the individual Qws are shown in FIG. 5. From such a gain characteristic, it is possible to select both the wavelength and polarization through control of the threshold gain, thereby leading to a dual-polarization, dual wavelength array.

Note in FIG. 5 that the solid-line curves 40, 41 representing, respectively, the lowest transparency current (TE-mode) and highest peak gain (TM-mode) for the longer wavelength ($\lambda_1$) diode pair, correspond to the curves in FIG. 1. The corresponding lowest transparency current (TE-Mode) and highest peak gain (TM-Mode) for the shorter wavelength ($\lambda_2$) diode pair are represented, respectively, by the dashed-line curves 42, 43. By adjustment of the various parameters described here and in the related cases, the operating conditions can be chosen such that with threshold current designated 38, the long wavelength TE-Mode emitter is activated at a first zone, and with threshold currents designated, respectively, 38$^1$, 39 and 39$^1$, the long wavelength TM-mode emitter, the short wavelength TE-mode emitter, and the short wavelength TM-mode emitter are activated, respectively, at second, third and fourth zones. Each emitting zone region would be pumped by its own two electrodes, or with one electrode each and sharing a common electrode. Thus, each emitter can be separately addressed and activated. The related applications describe in detail how the different polarization modes can be activated. As one simple example, the long wavelength QW can be made thin, or it can be displaced from the center of the waveguide, so that its modal gain saturates at a relatively low current. Likewise, greater peak gain can be achieved at the short wavelength by making the short-wavelength quantum well thicker, or by using multiple quantum wells.

Alternative, the active layer for the embodiment of FIG. 8 can be composed of two pairs of quantum wells separated by a barrier layer, where each pair is capable of lasing at a different wavelength and one quantum well for each pair is for TE-mode gain while the other is for TM-mode gain. One such pair of quantum wells intended for operation at 600–660 nm is illustrated in FIG. 3.

Additional quantum wells, each with a TE- and TM-mode gain characteristic as illustrated in FIG. 1 at a different wavelength, can be included in the structure to provide a dual-polarization, multiple-wavelength diode laser array.

Multiple-wavelength, dual polarization diode laser arrays can be formed in the embodiment of FIG. 8 in several alternate ways. The active layer can be composed of multiple quantum wells, each with a TE- and TM-mode gain characteristic as illustrated in FIG. 1 for a different wavelength. Alternatively, the active layer can be composed of multiple pairs of quantum wells separated by a barrier layer, where each pair is capable of lasing at a different wavelength and one quantum well of each pair is for TE-mode gain while the other is for TM-mode gain.

As described above and in more detail in the third and fourth above-referenced patent applications, the polarization mode can be controlled by introducing an additional loss into one of the active zones of each of the active regions. FIG. 8 also illustrates two preferred ways of introducing additional loss by providing an unpumped section or low mirror reflectivity, both of which will force the associated active zone to oscillate in the higher-gain polarization, in this instance, the TM-mode. FIG. 8 shows reflectors 90, 91, 92 and 93 having reflectivities R1, R2, R3 and R4, respectively, on the front facet of each of the lasing zones 75–78. A counterpart reflector 90'–92' is on the opposite facet. As will also be observed, the electrodes 80–83 have different lengths; the electrodes 80, 82 run the full length of the crystal, whereas electrodes 81 and 83 leave an area at the rear, designated 81' and 83', respectively, uncovered forming under the uncovered areas unpumped laser sections. Thus, by means of the unpumped sections 81', 83', lasers 75 and 78 can be forced to oscillate in the TM-mode. Alternatively, if the electrodes 81 and 83 ran the full length of the bodies, then by making the facet reflectivities R2 and R4 lower than that of R1 and R3, respectively, lasers 76 and 78 would also be forced to oscillate in the TM-mode. Both schemes, unpumped sections and lower reflectivity, could be combined into the same active zone. It will also be appreciated that these ways of controlling the polarization modes are also applicable to the other embodiments illustrated in FIGS. 2–4, 6, and 7.

A similar gain-current relationship can be achieved in a single QW laser, by utilizing the bandfilling effect, especially with thin QW lasers. Such a scheme is illustrated in FIG. 6, a structure containing a single, thin (tensile-strained) QW 57, with tensile-strained confining layers 54 at the left, and at the right with tensile-strained inner confining layers 55. FIG. 6 is a composite view, for comparison purposes, of two examples 58, 59 of single, tensile-strained QW structures designed for TE- and TM-mode gain at two wavelengths, with the band diagram of each structure depicted below and showing the two transitions possible in each case to generate the two wavelengths $\lambda_1$, $\lambda_2$. Bandfilling of the states associated with the QW, shown at 51 at the left hand side, shifts the oscillation to a shorter wavelength, $\lambda_2$, up to a photon energy characteristic of the confining layer bandgap shown by the larger arrow 52. The confining layers can be either bulk-like, shown at 54 at the left, or space-quantized, shown at 55 at the right, with a separate optical confinement heterostructure, in which case the thickness and composition of both the confining region and QW are adjusted so that the light- and heavy-hole band edges line up, thereby allowing either TE- or TM-mode operation at both the QW wavelength 56 and the confining layer wavelength 52. Either of these structures 58 or 59 can be used to realize multiple-wavelength operation from a dual-polarization device containing only a single QW active region. Multiple Qws can also be incorporated in such structures, allowing more freedom in attaining the long-wavelength TE- and TM-mode gain characteristic (using separate QWs for gain in each polarization).

The bandfilling effect is described in, for example "A model For GRIN-SCH-SQW Laser Diodes", by S. R. Chinn, P. S. Zory, A. R. Reisinger, IEEE Journal of Quantum Electronics, Vol. 24, No. 11, November 1988, pp. 2191–2214. Essentially, bandfilling is accomplished by forcing the threshold current density to be raised by introducing additional cavity loss. This drives the quasi-fermi levels deeper into the bands, consequently shifting the gain peak toward shorter wavelengths.

In the FIG. 6 embodiment, either active layer 58 or 59 is capable of supporting four, multiple wavelength, dual polarized diode lasers in accordance with the invention.

The same as, or a similar construction to that, in FIG. 8 is useful for achieving the behavior illustrated in FIG. 6, wherein the structure 58 shown at the left is capable of emitting TE- or TM-polarized beams at two different wavelengths, and the structure 59 shown at the right is capable of emitting TE- or TM-polarized beams at the same two wavelengths, both wavelengths being achieved on the basis of bandfilling by selectively introducing different amounts of cavity losses in two zones of each structure. Thus, by subdividing each of the structures 58 and 59 in two parts, and, as was done in the FIG. 8 embodiment, by providing one the two parts with an unpumped region or lower-reflectivity mirror, then the laser zone associated with the higher cavity loss will exhibit lasing transitions between the wider spaced energy levels of the structure and thus lases at the shorter wavelength $\lambda_2$. It will be noted that in this instance, the cavity loss is used to select or control the operating wavelength, whereas in the example of FIG. 8, the cavity loss is used to select the polarization mode of the emitted radiation. And it will also be observed that the polarization of the emissions of the resulting four lasing zones of the FIG. 6 embodiment is preferably not selected by the selectively introduced cavity loss but by the composition and crystal state (strained or unstrained) of the active, confining and waveguiding layers in that structure.

It will be appreciated that conventional methods of growing the various layers, as by MOVPE, are well known in the art and are described in published literature and in the referenced related cases, and need no further description.

In FIGS. 2 and 8, the AlGaInP devices are shown with a ridge-waveguide structure, the standard index-guided laser structure in this material system. The other devices, however, are shown with lateral waveguides formed by impurity-induced disordering. The exact device structure is unimportant for achieving the dual polarizations, and so any gain-guided, index-guided, or even broad-area structure could be used along with any of the material systems. Also, the two materials systems shown are not unique: the wavelength range available from any one of these materials systems allows laser wavelengths separated by more than 50 nm. Thus, there exist many combinations of AlGaInP and/or AlGa(In)AsP active region pairs that are both (1) sufficiently separated in wavelength, and (2) provide the required TE- and TM-mode gain-current characteristic.

The techniques described above can also be applied to greater numbers of active region wavelengths. Ultimately, the maximum number is determined by the range of wavelengths available from the appropriate materials system (together the AlGaInP and InGaAsP on GaAs substrates systems span the wavelength range 600–850 nm), and the requisite wavelength separation (dictated by the response curves of the various photoreceptor materials used in laser printers, for example). For each active region wavelength, the use of orthogonal polarizations will double the number of distinguishable sources.

The advantage of the structures described over other multiple-source devices are:

1. Compared to the other multiple wavelength sources, with separate active regions for each wavelength, the number of separable sources is doubled by taking advantage of the orthogonal polarizations.

2. For each wavelength, a single active region structure can be used for achieving both polarizations; for example, for the 600–650 nm band, AlGaInP on GaAs materials system, and for the 600–850 nm range, either AlGaAsP or InGaAsP on GaAs substrates.

3. Multiple QW active regions can be used to provide TE- and TM-mode gain at different wavelengths, so that a multiple-wavelength, dual polarization array can be built using a single epitaxial growth, of one laser structure.

4. A single QW active region, embedded in a tensile-strained confining region, can be used to realize a dual-wavelength, dual-polarization source.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. This scope of the invention is indicated by the appended claims rather than by the foregoing description.

What is claimed is:

1. A dual-wavelength, dual polarization laser diode array, comprising:

(a) a common semiconductor body having side-by-side first and second active regions, (b) said first active region having first and second laterally-spaced zones that are capable of emitting TE-polarized radiation and TM-polarized radiation, respectively, at a first wavelength, (c) said second active region having third and fourth laterally-spaced zones that are capable of emitting TE-polarized and TM-polarized radiation, respectively, at a second wavelength that is different from the first wavelength, (d) electrodes connected to the body for separately introducing carriers into said zones of the diode laser array to cause each zone to independently emit radiation, (e) optical reflectors associated with the body to form at least one optical cavity for lasing radiation, (f) polarization selecting means connected to said first and second zones of the first active region for causing the first and second zones to emit, respectively, TE-polarized and TM-polarized radiation at said first wavelength, (g) polarization selecting means connected to said third and fourth zones of the second active region for causing said third and fourth zones to emit, respectively, TE-polarized and TM-polarized radiation at said second wavelength.

2. The laser diode array of claim 1, wherein said polarization selecting means comprises different amounts of cavity loss in said first and second zones of said first active region and different amounts of cavity loss in said third and fourth zones of said second active region.

3. The laser diode array of claim 1, wherein said polarization selecting means comprises different reflectivities for said optical reflectors of said first and second zones of said first active region and different reflectivities for said optical reflectors of said third and fourth zones of said second active region.

4. The laser diode array of claim 1, wherein said first and second active regions have different compositions.

5. The laser diode array of claim 1, wherein the first active region comprises AlGaInP and the second active region comprises AlGaAsP or InGaAsP.

6. The laser diode array of claim 1, wherein the first active region comprises a $Ga_zIn_{1-z}P$ quantum well layer for TE-mode gain and a $Ga_xIn_{1-x}P$ quantum well layer for TM-mode gain, where $X \neq Z$.

7. A dual-wavelength, dual polarization laser diode array, comprising:

(a) a common semiconductor body having side-by-side first and second active regions, (b) said first active region having first and second laterally-spaced zones that are capable of emitting TE-polarized radiation and TM-polarized radiation, respectively, at a first wavelength, (c) said second active region having third and fourth laterally-spaced zones that are capable of emitting TE-polarized and TM-polarized radiation, respectively, at a second wavelength that is different from the first wavelength, (d) said first and second active regions each comprising a quantum well producing a gain-current relationship wherein transparency current is lowest in one polarization mode and peak gain is highest in the orthogonal polarization mode, (e) electrodes connected to the body for separately introducing carriers into said zones of the diode laser array to cause each zone to independently emit radiation, (f) optical reflectors associated with the body to form at least one optical cavity for lasing radiation, (g) polarization selecting means connected to said first and second zones of the first active region for causing the first and second zones to emit, respectively, TE-polarized and TM-polarized radiation at said first wavelength, (h) polarization selecting means connected to said third and fourth zones of the second active region for causing said third and fourth zones to emit, respectively, TE-polarized and TM-polarized radiation at said second wavelength.

8. The laser diode array of claim 7, wherein said polarization selecting means comprises different amounts of cavity loss in said first and second zones of said first active region and different amounts of cavity loss in said third and fourth zones of said second active region.

9. The laser diode array of claim 7, wherein said polarization selecting means comprises different reflectivities for said optical reflectors of said first and second zones of said first active region and different reflectivities for said optical reflectors of said third and fourth zones of said second active region.

10. The laser diode array of claim 7, wherein said first and second active regions have different compositions.

11. The laser diode array of claim 7, wherein the first active region comprises AlGaInP and the second active region comprises AlGaAsP or InGaAsP.

12. The laser diode array of claim 7, wherein the first active region comprises a $Ga_zIn_{1-z}P$ quantum well layer for TE-mode gain and a $Ga_xIn_{1-x}P$ quantum well layer for TM-mode gain, where $x \neq z$.

13. A multiple-wavelength, dual polarization laser diode array, comprising:

(a) a common semiconductor body having a plurality of separated active layers, wherein each active layer is capable of both TE-mode and TM-mode gain at substantially one wavelength that is substantially different from each wavelength of the other active layers;

(b) side-by-side laterally-spaced zones of said plurality of active layers;

(c) optical reflectors associated with the body to form at least one optical cavity for lasing radiation;

(d) electrodes connected to the body for separately introducing carriers into said zones of the diode laser array to cause each zone to independently emit radiation, (e) polarization and wavelength selecting means connected to each of said zones for causing each zone to emit either TE polarized or TM-polarized radiation at one of said plurality of wavelengths.

14. The laser diode array of claim 13, wherein said polarization and wavelength selecting means comprises different amounts of cavity loss in each of said zones for causing each zone to emit either TE-polarized or TM-polarized radiation at one of said plurality of wavelengths.

15. The laser diode array of claim 13, wherein said polarization and wavelength selecting means comprises different reflectivities for said optical reflectors of each of said zones for causing each zone to emit either TE-polarized or TM-polarized radiation at one of said plurality of wavelengths.

16. The laser diode array of claim 13, wherein said separated active layers have different compositions.

17. The laser diode array of claim 13, wherein said separated active layers comprise AlGaInP, GaInAsP, or AlGaAsP.

18. The laser diode array of claim 13, wherein one of said separated active layer is a quantum well producing a gain-current relationship whereby the transparency current is lowest in one polarization mode and the peak gain is highest in the orthogonal polarization mode.

19. At The laser diode array of claim 13, wherein one of said separated active layers comprises a $Ga_zIn_{1-z}P$ quantum well layer for TE-mode gain and a $Ga_xIn_{1-x}P$ quantum well layer for TM-mode gain, where $x \neq z$.

20. A dual-wavelength, dual polarization laser diode array, comprising:
  (a) a common semiconductor body having an active layer capable of both TE-mode and TM-mode gain at substantially a first wavelength and of both TE-mode and TM-mode gain at a second wavelength that is substantially different from said first wavelength;
  (b) side-by-side laterally-spaced zones of said first and second active layers,
  (c) optical reflectors associated with the body to form at least one optical cavity for lasing radiation;
  (d) electrodes connected to the body for separately introducing carriers into each zone to cause said zone to independently emit radiation,
  (e) polarization and wavelength selecting means connected to each of said zones for causing said first and second zones to emit, respectively, TE-polarized and TM-polarized radiation at said first wavelength and said third and fourth zones to emit, respectively, TE-polarized and TM-polarized radiation at said second wavelength.

21. The laser diode array of claim 20, wherein said active layer comprises first and second separated layers, wherein said first separated layer is capable of both TE-mode and TM-mode gain at substantially a first wavelength and said second separated layer is capable of both TE-mode and TM-mode gain at a second wavelength that is substantially different from said first wavelength.

22. The laser diode array of claim 20, wherein said active layer comprises a first separated layer capable of TE-mode gain at a first wavelength, a second separated layer capable of TM-mode gain at said first wavelength, a third separated layer capable of TE-mode gain at a second wavelength that is substantially different from said first wavelength, and a fourth separated layer capable of TM-mode gain at said second wavelength.

23. The laser diode array of claim 20, wherein said active layer comprises a quantum well flanked by confining layers to produce a band structure capable of lasing on transitions between states associated with the quantum well to produce the first wavelength and of lasing on transitions between states associated with the confining layers to produce the second wavelength.

24. The laser diode array of claim 23, wherein the confining layer has bulk properties or is tensile-strained.

25. The laser diode array of claim 20, wherein said polarization and wavelength selecting means comprises different amounts of cavity loss in each of said zones for causing each zone to emit either TE-polarized or TM-polarized radiation at said first or second wavelength.

26. The laser diode array of claim 20, wherein said polarization and wavelength selecting means comprises different reflectivities for said optical reflectors of each of said zones for causing each zone to emit either TE-polarized or TM-polarized radiation at said first or second wavelength.

27. The laser diode array of claim 20, wherein said separated layers have different compositions.

28. The laser diode array of claim 20, wherein said separated layers comprise AlGaInP, GaInAsP, or AlGaAsP.

29. The laser diode array of claim 20, wherein said separated layer is a GaInAsP or AlGaAsP quantum well layer and said second separated layer is a GaInP quantum well layer.

30. The laser diode array of claim 20, wherein one of said separated layers comprises a quantum well producing a gain-current relationship whereby the transparency current is lowest in one polarization mode and the peak gain is highest in the orthogonal polarization mode.

31. The laser diode array of claim 20, wherein one of said separated layers comprises a $Ga_zIn_{1-z}P$ quantum well layer for TE-mode gain and a $Ga_xIn_{1-x}P$ quantum well layer for TM-mode gain, where $x \neq z$.

32. A multiple-wavelength, dual polarization laser diode array, comprising:
  (a) a common semiconductor body having a plurality of separated active layers, wherein each active layer is capable of either TE-mode or TM-mode gain at substantially one wavelength that is substantially different from each wavelength of the other active layers;
  (b) side-by-side laterally-spaced zones of said plurality of active layers;
  (c) optical reflectors associated with the body to form at least one optical cavity for lasing radiation;
  (d) electrodes connected to the body for separately introducing carriers into said zones of the diode laser array to cause each zone to independently emit radiation;
  (e) polarization and wavelength selecting means connected to each of said zones for causing each zone to emit either TE-polarized or TM-polarized radiation at one of said plurality of wavelengths.

33. The laser diode array of claim 32, wherein said polarization and wavelength selecting means comprises different amounts of cavity loss in each of said zones for causing each zone to emit either TE-polarized or TM-polarized radiation at one of said plurality of wavelengths.

34. The laser diode array of claim 32, wherein said polarization and wavelength selecting means comprises different reflectivities for said optical reflectors of each of said zones for causing each zone to emit either TE-polarized or TM-polarized radiation at one of said plurality of wavelengths.

35. The laser diode array of claim 32, wherein said separated active layers have different compositions.

36. The laser diode array of claim 32, wherein said separated active layers comprise AlGaInP, GaInAsP, or AlGaAsP.

37. The laser diode array of claim 32, wherein one of said separated active layer is a quantum well producing a gain-current relationship whereby the transparency current is lowest in one polarization mode and the peak gain is highest in the orthogonal polarization mode.

38. The laser diode array of claim 32, wherein one of said separated active layers comprises a $Ga_zIn_{1-z}P$ quantum well layer for TE-mode gain and one of said separated active layers comprises a $Ga_xIn_{1-x}P$ quantum well layer for TM-mode gain, where $x \neq z$.

39. A multiple-wavelength, dual polarization laser diode array, comprising:
  (a) a common semiconductor body having first and second separated active layers, wherein said first active layer is capable of TE-mode gain at a plurality of different wavelengths and said second active layer is capable of TM-mode gain at said plurality of wavelengths;
  (b) side-by-side laterally-spaced zones of said first and second active layers;
  (c) optical reflectors associated with the body to form at least one optical cavity for lasing radiation;
  (d) electrodes connected to the body for separately introducing carriers into said zones of the diode laser array to cause each zone to independently emit radiation, (e) polarization and wavelength selecting means connected to each of said zones for causing each zone to emit either TE-polarized or TM-polarized radiation at one of said plurality of wavelengths.

40. The laser diode array of claim 39, wherein said polarization and wavelength selecting means comprises different amounts of cavity loss in each of said zones for causing each zone to emit either TE-polarized or TM-polarized radiation at one of said plurality of wavelengths.

41. The laser diode array of claim 39, wherein said polarization and wavelength selecting means comprises different reflectivities for said optical reflectors of each of said zones for causing each zone to emit either TE-polarized or TM-polarized radiation at one of said plurality of wavelengths.

42. The laser diode array of claim 39, wherein said separated active layers have different compositions.

43. The laser diode array of claim 39, wherein said separated active layers comprise AlGaInP, GaInAsP, or AlGaAsP.

44. The laser diode array of claim 39, wherein one of said separated active layers contains a quantum well producing a gain-current relationship whereby the transparency current is lowest in one polarization mode and the peak gain is highest in the orthogonal polarization mode.

45. The laser diode array of claim 39, wherein one of said separated active layers comprises a quantum well flanked by confining layers to produce a band structure capable of lasing on transitions between states associated with the quantum well to produce the first wavelength and of lasing on transitions between states associated with the confining layers to produce the second wavelength.

46. The laser diode array of claim 39, wherein one of said separated active layers capable of TE-mode gain comprises a $Ga_zIn_{1-z}P$ quantum well layer and one of said separate active layers capable of TM-mode gain comprises a $Ga_xIn_{1-x}P$ quantum well layer, where $x \neq z$.

47. A dual-wavelength, dual polarization laser diode array, comprising:

(a) a common semiconductor body having first and second separated active layers, wherein said first active layer is capable of TE-mode gain at both a first and a second wavelength that is substantially different from said first wavelength and said second active layer is capable of TM-mode gain at said first and second wavelengths;

(b) side-by-side laterally-spaced zones of said first and second active layers;

(c) optical reflectors associated with the body to form at least one optical cavity for lasing radiation;

(d) electrodes connected to the body for separately introducing carriers into said zones of the diode laser array to cause each zone to independently emit radiation;

(e) polarization and wavelength selecting means connected to each of said zones for causing said first and second zones to emit TE-polarized radiation, respectively, at said first and second wavelengths and said third and fourth zones to emit TM-polarized radiation, respectively, at said first and second wavelengths.

48. The laser diode array of claim 47, wherein said polarization and wavelength selecting means comprises different amounts of cavity loss in each of said zones for causing each zone to emit either TE-polarized or TM-polarized radiation at said first or second wavelength.

49. The laser diode array of claim 47, wherein said polarization and wavelength selecting means comprises different reflectivities for said optical reflectors of each of said zones for causing each of said zones to emit either TE-polarized or TM-polarized radiation at said first or second wavelength.

50. The laser diode array of claim 47, wherein said first and second separated active layers have different compositions.

51. The laser diode array of claim 47, wherein said first and second separated active layers comprise AlGaInP, GaInAsP, or AlGaAsP.

52. The laser diode array of claim 47, wherein said first separated active layer contains a GaInAsP quantum well and said second separated active layer contains a GaInP quantum well.

53. The laser diode array of claim 47, wherein one of said separated active layers contains a quantum well producing a gain-current relationship whereby the transparency current is lowest in one polarization mode and the peak gain is highest in the orthogonal polarization mode.

54. The laser diode array of claim 47, wherein one of said separated active layers capable of TE-mode gain comprises a $Ga_zIn_{1-z}P$ quantum well layer and one of said separate active layers capable of TM-mode gain comprises a $Ga_xIn_{1-x}P$ quantum well layer, where $x \neq z$.

55. The laser diode array of claim 47, wherein one of said separated active layers comprises a quantum well flanked by confining layers to produce a band structure capable of lasing on transitions between states associated with the quantum well to produce the first wavelength and of lasing on transitions between states associated with the confining layers to produce the second wavelength.

56. The laser diode array of claim 55, wherein the confining layer properties is tensile-strained or compressively strained.

57. A dual-wavelength, dual polarization laser diode array, comprising:

(a) a common semiconductor substrate with a plurality of layers having first and second active regions separated by an first upper cladding layer for said first active region, a contact layer and a first lower cladding layer for said second active region;

(b) said first active region being sandwiched between a second lower cladding layer and said first upper cladding layer and having at least first and second laterally spaced zones capable of emitting TE-polarized radiation and TM-polarized radiation, respectively, at a first wavelength;

(c) said second active region being sandwiched between said first lower cladding layer and a second upper cladding layer and having at least third and fourth laterally-spaced zones capable of emitting TE-polarized radiation and TM-polarized radiation, respectively, at a second wavelength;

(d) optical reflectors associated with the body to form at least one optical cavity for lasing radiation;

(e) first electrodes connected to said substrate and said first upper cladding layer for separately introducing carriers into the first and second zones to cause each zone to independently emit radiation;

(f) second electrodes connected to said contact layer and said second upper cladding layer for separately introducing carriers into the third and fourth zones to cause each zone to independently emit radiation;

(g) polarization selecting means connected to said first and second zones of the first active region for causing the first and second zones to emit, respectively, TE-polarized and TM-polarized radiation at said first wavelength, (h) polarization selecting means connected to said third and fourth zones of the second active region for causing said third and fourth zones to emit, respectively, TE-polarized and TM-polarized radiation at said second wavelength.

58. The laser diode array of claim 57, wherein said polarization selecting means comprises different amounts of cavity loss in said first and second zones of said first active region and different amounts of cavity loss in said third and fourth zones of said second active region.

59. The laser diode array of claim 57, wherein said polarization selecting means comprises different reflectivities for said optical reflectors of said first and second zones of said first active region and different reflectivities for said optical reflectors of said third and fourth zones of said second active region.

60. The laser diode array of claim 57, wherein said first and second active regions have different compositions.

61. The laser diode array of claim 57, wherein the first active region comprises AlGaInP and the second active region comprises AlGaAsP or InGaAsP.

62. The laser diode array of claim 57, wherein the first active region comprises a $Ga_zIn_{1-z}P$ quantum well layer for TE-mode gain and a $Ga_xIn_{1-x}P$ quantum well layer for TM-mode gain, where $x \neq z$.

63. A dual-wavelength, dual polarization laser diode array, comprising:

(a) a common semiconductor substrate with a plurality of layers having first and second active regions separated by an first upper cladding layer for said first active region, a contact layer and a first lower cladding layer for said second active region;

(b) said first active region being sandwiched between a second lower cladding layer and said first upper cladding layer and having at least first and second laterally spaced zones capable of emitting TE-polarized radiation, respectively, at a first and second wavelength;

(c) said second active region being sandwiched between said first lower cladding layer and a second upper cladding layer and having at least third and fourth laterally-spaced zones capable of emitting TM-polarized radiation, respectively, at said first and second wavelengths;

(d) optical reflectors associated with the body to form at least one optical cavity for lasing radiation;

(e) first electrodes connected to said substrate and said first upper cladding layer for separately introducing carriers into the first and second zones to cause each zone to independently emit radiation;

(f) second electrodes connected to said contact layer and said second upper cladding layer for separately introducing carriers into the third and fourth zones to cause each zone to independently emit radiation;

(g) wavelength selecting means connected to said first and second zones of the first active region for causing the first and second zones to emit TE-polarized radiation, respectively, at said first and second wavelengths, (h) wavelength selecting means connected to said third and fourth zones of the second active region for causing said third and fourth zones to emit TM-polarized radiation, respectively, at said first and second wavelengths.

64. The laser diode array of claim 63, wherein said wavelength selecting means comprises different amounts of cavity loss in said first and second zones of said first active region and different amounts of cavity loss in said third and fourth zones of said second active region.

65. The laser diode array of claim 63, wherein said wavelength selecting means comprises different reflectivities for said optical reflectors of said first and second zones of said first active region and different reflectivities for said optical reflectors of said third and fourth zones of said second active region.

66. The laser diode array of claim 63, wherein said first and second active regions have different compositions.

67. The laser diode array of claim 63, wherein one of said active regions comprises AlGaInP, AlGaAsP or InGaAsP.

68. The laser diode array of claim 63, wherein one of said active regions contains a $Ga_zIn_{1-z}P$ quantum well layer for TE-mode gain or a $Ga_xIn_{1-x}P$ quantum well layer for TM-mode gain, where $x \neq z$.

69. The laser diode array of claim 63, wherein one of said active regions comprises a quantum well flanked by confining layers to produce a band structure capable of lasing on transitions between states associated with the quantum well to produce the first wavelength and of lasing on transitions between states associated with the confining layers to produce the second wavelength.

70. The laser diode array of claim 69, wherein the confining layer is tensile-strained or compressive-strained.

71. A dual-wavelength, dual polarization laser diode array, comprising:

(a) a common semiconductor body an active layer comprising a quantum well layer flanked by confining layers capable of TE-mode and TM-mode gain at a first wavelength between states associated with the quantum well and of TE-mode and TM-mode gain at a second wavelength between states associated with the confining layers, (b) side-by-side first, second, third, and fourth laterally-spaced zones of said active layer, (c) electrodes connected to the body for separately introducing carriers into said zones of the diode laser array to cause each zone to independently emit radiation, (d) optical reflectors associated with the body to form at least one optical cavity for lasing radiation, (e) polarization selecting means connected to said first and second zones for causing the first and second zones to emit, respectively, TE-polarized and TM-polarized radiation at said first wavelength, (f) polarization selecting means connected to said third and fourth zones for causing said third and fourth zones to emit, respectively, TE-polarized and TM-polarized radiation at said second wavelength.

72. The laser diode array of claim 71, wherein said polarization and wavelength selecting means comprises different amounts of cavity loss in each of said zones for causing each zone to emit either TE-polarized or TM-polarized radiation at one of said plurality of wavelengths.

73. The laser diode array of claim 71, wherein said polarization and wavelength selecting means comprises different reflectivities for said optical reflectors of each of said zones for causing each zone to emit either TE-polarized or TM-polarized radiation at one of said plurality of wavelengths.

74. The laser diode array of claim 71, wherein said active layer comprises AlGaInP, GaInAsP, or AlGaAsP.

75. The laser diode array of claim 71, wherein one of said quantum well layer produces a gain-current relationship whereby the transparency current is lowest in one polarization mode and the peak gain is highest in the orthogonal polarization mode.

* * * * *

UNITED STATES PATENT AND TRADEMARK OFFICE
CERTIFICATE OF CORRECTION

| | | |
|---|---|---|
| PATENT NO. | : 5,465,263 | |
| APPLICATION NO. | : 08/332989 | |
| DATED | : November 7, 1995 | |
| INVENTOR(S) | : David P. Bour et al. | |

It is certified that error appears in the above-identified patent and that said Letters Patent is hereby corrected as shown below:

Column 1,
Line 48, insert as a new paragraph:
-- This invention was made with Government support under Agreement No. 70NANB2H1241 awarded by the Department of Commerce. The Government has certain rights in this invention. --.

Signed and Sealed this

Twenty-seventh Day of June, 2006

JON W. DUDAS
*Director of the United States Patent and Trademark Office*